United States Patent
Sutardja et al.

(10) Patent No.: US 9,047,945 B2
(45) Date of Patent: Jun. 2, 2015

(54) SYSTEMS AND METHODS FOR READING RESISTIVE RANDOM ACCESS MEMORY (RRAM) CELLS

(71) Applicant: Marvell World Trade Ltd., St. Michael (BB)

(72) Inventors: Pantas Sutardja, Los Gatos, CA (US); Albert Wu, Palo Alto, CA (US); Runzi Chang, San Jose, CA (US); Winston Lee, Palo Alto, CA (US); Peter Lee, Pleasanton, CA (US)

(73) Assignee: Marvell World Trade LTD., St. Michael (BB)

( * ) Notice: Subject to any disclaimer, the term of this patent is extended or adjusted under 35 U.S.C. 154(b) by 0 days.

(21) Appl. No.: 14/050,678

(22) Filed: Oct. 10, 2013

(65) Prior Publication Data
US 2014/0104926 A1    Apr. 17, 2014

Related U.S. Application Data

(60) Provisional application No. 61/713,900, filed on Oct. 15, 2012.

(51) Int. Cl.
G11C 13/00    (2006.01)
G11C 7/06    (2006.01)
G11C 11/16    (2006.01)

(52) U.S. Cl.
CPC .......... G11C 13/004 (2013.01); G11C 13/0002 (2013.01); G11C 7/067 (2013.01); G11C 11/1673 (2013.01)

(58) Field of Classification Search
CPC ............. G11C 13/004; G11C 13/0002; G11C 13/0004; G11C 2013/0002; G11C 2013/004; G11C 2013/0054; G11C 7/067

USPC ........ 365/148, 158, 163, 189.07, 189.15, 194
See application file for complete search history.

(56) References Cited

U.S. PATENT DOCUMENTS 5,392,235 A    2/1995    Nishitani et al.
5,706,226 A    1/1998    Chan et al.
(Continued)

FOREIGN PATENT DOCUMENTS

| EP | 001144 A1 | 5/1980 |
|----|-----------|--------|
| EP | 1426975 A2 | 6/2004 |

(Continued)

OTHER PUBLICATIONS

International Search Report for PCT/US2013/064819 dated Feb. 11, 2014; 7 Pages.
(Continued)

*Primary Examiner* — Tan T. Nguyen

(57) ABSTRACT

A system including a resistive random access memory cell connected to a word line and a bit line and a pre-charge circuit configured to pre-charge the bit line to a first voltage with the word line being unselected. A driver circuit selects the word line at a first time subsequent to the bit line being charged to the first voltage. A comparator compares a second voltage on the bit line to a third voltage supplied to the comparator and generates an output based on the comparison. A latch latches the output of the comparator and generates a latched output. A pulse generator generates a pulse after a delay subsequent to the first time to clock the latch to latch the output of the comparator and generate the latched output. The latched output indicates a state of the resistive random access memory cell.

20 Claims, 12 Drawing Sheets

(56) References Cited

U.S. PATENT DOCUMENTS

| | | | |
|---|---|---|---|
| 6,671,197 B2 | 12/2003 | Athanassiadis | |
| 7,495,944 B2 * | 2/2009 | Parkinson et al. | 365/148 |
| 7,499,349 B2 | 3/2009 | Roehr | |
| 7,570,524 B2 * | 8/2009 | Bedeschi et al. | 365/189.06 |
| 7,835,171 B2 | 11/2010 | Ono et al. | |
| 7,903,448 B2 | 3/2011 | Oh et al. | |
| 8,059,448 B2 | 11/2011 | Tanigami et al. | |
| 8,064,241 B2 | 11/2011 | Morita et al. | |
| 8,760,927 B2 | 6/2014 | Deng | |
| 8,817,528 B2 | 8/2014 | Otto et al. | |
| 8,885,388 B2 | 11/2014 | Sutardja et al. | |
| 2004/0252548 A1 | 12/2004 | Tsukamoto et al. | |
| 2008/0310221 A1 | 12/2008 | Baker | |
| 2009/0243652 A1 | 10/2009 | Dorairaj et al. | |
| 2009/0303785 A1 * | 12/2009 | Hwang et al. | 365/163 |
| 2010/0097844 A1 | 4/2010 | Liu | |
| 2010/0110762 A1 | 5/2010 | Chen et al. | |
| 2010/0142245 A1 | 6/2010 | Kitagawa | |
| 2010/0157706 A1 | 6/2010 | Cho et al. | |
| 2010/0259968 A1 | 10/2010 | Tsushima et al. | |
| 2010/0296334 A1 | 11/2010 | Houston et al. | |
| 2010/0296336 A1 | 11/2010 | Houston | |
| 2011/0007553 A1 | 1/2011 | Takagi et al. | |
| 2011/0051499 A1 | 3/2011 | Hamilton | |
| 2011/0228599 A1 | 9/2011 | Tian et al. | |
| 2012/0014171 A1 | 1/2012 | Chuang et al. | |
| 2012/0063196 A1 * | 3/2012 | Kim et al. | 365/148 |
| 2012/0087175 A1 | 4/2012 | Zhu et al. | |
| 2012/0140552 A1 | 6/2012 | Seikh et al. | |
| 2012/0155151 A1 | 6/2012 | Rachamadugu et al. | |
| 2014/0003126 A1 | 1/2014 | Huang | |
| 2014/0104927 A1 | 4/2014 | Sutardja et al. | |
| 2014/0112057 A1 | 4/2014 | Sutardja et al. | |
| 2014/0119103 A1 | 5/2014 | Lee et al. | |
| 2014/0133217 A1 | 5/2014 | Lee et al. | |

FOREIGN PATENT DOCUMENTS

| | | |
|---|---|---|
| EP | 2063467 A1 | 5/2009 |
| WO | WO-2007138646 A1 | 12/2007 |
| WO | WO-2009013819 A1 | 1/2009 |

OTHER PUBLICATIONS

International Search Report for related PCT Application No. PCT/US2013/066303; May 16, 2014; 6 pages.
International Search Report for related PCT Application No. PCT/US2013/067441; Jan. 23, 2014; 7 pages.
U.S. Appl. No. 14/050,696, Pantas Sutardja et al.
U.S. Appl. No. 14/059,790, Pantas Sutardja et al.
U.S. Appl. No. 14/066,796, Winston Lee et al.
U.S. Appl. No. 14/066,817, Pantas Sutardja.
Synopsys Insight Newsletter; FinFET: The Promises and the Challenges; Issue 3, 2012; 5 pages.
International Search Report for PCT Application No. 2013/064811 dated Dec. 6, 2013; 3 Pages.
Notification of Transmittal of the International Search Report and the Written Opinion of the International Searching Authority, or the Declaration dated Feb. 3, 2014 in reference to PCT/US2013/067454 (13 pgs).
Xu Wang et al: "A nove 1 1 ow power 64- kb SRAM using bit-lines charge-recycling and non-uniform cell scheme", Electronics, Circuits and Systems (ICECS), 2011 18th IEEE International Conference on, IEEE, Dec. 11, 2011, pp. 528-531.

* cited by examiner

SYSTEMS AND METHODS FOR READING RESISTIVE RANDOM ACCESS MEMORY (RRAM) CELLS

CROSS-REFERENCE TO RELATED APPLICATIONS

This application claims the benefit of U.S. Provisional Application No. 61/713,900, filed on Oct. 15, 2012. The entire disclosure of the application referenced above is incorporated herein by reference.

FIELD

The present disclosure relates to systems and methods for reading resistive random access memory (RRAM) cells.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A resistive random access memory (RRAM) array includes RRAM cells arranged at intersections of word lines and bit lines. A RRAM cell includes an insulating material as a resistive element. The resistance of the insulating material increases when current is passed through the insulating material in one direction and decreases when current is passed through the insulating material in an opposite direction. Accordingly, the RRAM cell can be programmed to a high resistance state by passing current through the RRAM cell in one direction and a low resistance state by passing current through the RRAM cell in an opposite direction. The high resistance state can be used to denote logic high (binary 1), and the low resistance state can be used to denote logic low (binary 0), or vice versa.

RRAM cells that are programmed to high and low resistance states using currents of opposite polarities are called bipolar RRAM cells. Alternatively, RRAM cells can be programmed to high and low resistance states by passing currents of two different magnitudes in the same direction through the insulating material of the RRAM cells. RRAM cells that are programmed to high and low resistance states using currents of two different magnitudes in the same direction are called unipolar RRAM cells.

Each RRAM cell includes a switching element such as a diode or a transistor. The switching element is connected in series with the insulating material (i.e., the resistive element). Using the switching element, the RRAM cells in the RRAM array can be selected and deselected during read and write operations.

SUMMARY

A system comprises a resistive random access memory cell connected to a word line and a bit line, and a pre-charge circuit configured to pre-charge the bit line to a first voltage with the word line being unselected. The system further comprises a driver circuit configured to select the word line at a first time subsequent to the bit line being charged to the first voltage, and a comparator configured to compare a second voltage on the bit line to a third voltage supplied to the comparator and generate an output based on the comparison. The system further comprises a latch configured to latch the output of the comparator and to generate a latched output. The system further comprises a pulse generator configured to generate a pulse after a delay subsequent to the first time to clock the latch to latch the output of the comparator and to generate the latched output. The latched output indicates a state of the resistive random access memory cell.

In other features, the delay is programmable and is selected based on a parasitic capacitance of the bit line, resistance values corresponding to a high-resistance state and a low-resistance state of a resistive element of the resistive random access memory cell, and characteristics of a switching element of the resistive random access memory cell.

In another feature, the delay is programmable and is selected based on process variations.

In other features, the delay is programmable and is selected during manufacture of a memory array comprising the resistive random access memory cell, or in response to a power supply to the memory array comprising the resistive random access memory cell being turned on, or both.

In other features, the comparator includes an inverter, and the first voltage and the third voltage are (i) adjustable between a reference voltage and a supply voltage of a memory array comprising the resistive random access memory cell, (ii) less than a voltage that damages the resistive random access memory cell, and (iii) selected to allow sensing of a high-resistance state and a low-resistance state of a resistive element of the resistive random access memory cell.

In other features, the comparator includes an inverter, the inverter includes transistors having a selected threshold voltage, and the selected threshold voltage allows reducing a supply voltage of a memory array comprising the resistive random access memory cell to less than a selected value to save power and lowering the third voltage to less than the supply voltage.

In other features, the comparator includes an inverter, the inverter includes transistors having a selected threshold voltage, and the selected threshold voltage allows reducing a supply voltage of a memory array comprising the resistive random access memory cell to less than the selected threshold voltage while allowing sensing of a high-resistance state and a low-resistance state of a resistive element of the resistive random access memory cell.

In still other features, a system comprises a resistive random access memory cell connected to a word line and a bit line, a current source configured to source current through the bit line, and a driver circuit configured to select the word line. The system further comprises a comparator configured to compare a first voltage on the bit line to a second voltage supplied to the comparator and to generate an output based on the comparison. The system further comprises a latch configured to latch the output of the comparator and to generate a latched output. The system further comprises a pulse generator configured to generate a pulse after a delay to latch the output of the comparator and to generate the latched output. The delay is greater than a settling time of the first voltage. The latched output indicates a state of the resistive random access memory cell.

In other features, the current, the second voltage, or both are programmable and are selected to allow the comparator to distinguish between a high-resistance state and a low-resistance state of a resistive element of the resistive random access memory cell.

In another feature, the current is programmable and is selected based on process variations.

In other features, the current, the second voltage, or both are programmable and are selected during manufacture of a memory array comprising the resistive random access memory cell, or in response to a power supply to the memory array comprising the resistive random access memory cell being turned on, or both.

In other features, the comparator includes an inverter, and the second voltage is (i) adjustable between a reference voltage and a supply voltage of a memory array comprising the resistive random access memory cell, (ii) less than a voltage that damages the resistive random access memory cell, and (iii) selected to allow sensing of a high-resistance state and a low-resistance state of a resistive element of the resistive random access memory cell.

In other features, the comparator includes an inverter, the inverter includes transistors having a selected threshold voltage, and the selected threshold voltage allows reducing a supply voltage of a memory array comprising the resistive random access memory cell to less than a selected value to save power and lowering the second voltage to less than the supply voltage.

In other features, the comparator includes an inverter, the inverter includes transistors having a selected threshold voltage, and the selected threshold voltage allows reducing a supply voltage of a memory array comprising the resistive random access memory cell to less than the selected threshold voltage while allowing sensing of a high-resistance state and a low-resistance state of a resistive element of the resistive random access memory cell.

In other features, the comparator is configured to turn on in response to receiving the pulse and turn off in response to the latch latching the output of the comparator and generating the latched output.

In another feature, the driver supplies a third voltage to the word line in response to selecting the word line. The third voltage less than a sum of a voltage that damages the resistive random access memory cell and a threshold voltage of a transistor used as a switching element in the resistive random access memory cell.

In another feature, the system further comprises a feedback amplifier configured to receive a feedback voltage from the bit line and a third voltage that is less than a voltage that damages the resistive random access memory cell, and to limit the first voltage to less than the voltage that damages the resistive random access memory cell.

In still other features, a method comprises connecting a resistive random access memory cell to a word line and a bit line, pre-charging the bit line to a first voltage with the word line being unselected, and selecting the word line at a first time subsequent to the bit line being charged to the first voltage. The method further comprises comparing a second voltage on the bit line to a third voltage supplied to the comparator and generating an output based on the comparison and generating a pulse after a delay subsequent to the first time to latch the output of the comparator. The latched output indicates a state of the resistive random access memory cell.

In other features, the first voltage and the third voltage are (i) adjustable between a reference voltage and a supply voltage of a memory array comprising the resistive random access memory cell, (ii) less than a voltage that damages the resistive random access memory cell, and (iii) selected to allow sensing of a high-resistance state and a low-resistance state of a resistive element of the resistive random access memory cell.

In other features, the comparing is performed using an inverter, and the inverter includes transistors having a selected threshold voltage. The selected threshold voltage allows reducing a supply voltage of a memory array comprising the resistive random access memory cell to less than a selected value to save power and lowering the third voltage to less than the supply voltage. The selected threshold voltage allows reducing the supply voltage to less than the selected threshold voltage while allowing sensing of a high-resistance state and a low-resistance state of a resistive element of the resistive random access memory cell.

In still other features, a method comprises connecting a resistive random access memory cell to a word line and a bit line, sourcing current through the bit line, and selecting the word line. The method further comprises comparing a first voltage on the bit line to a second voltage supplied to the comparator and generating an output based on the comparison. The method further comprises generating a pulse after a delay to latch the output of the comparator. The delay is greater than a settling time of the first voltage. The latched output indicates a state of the resistive random access memory cell.

In other features, the current, the second voltage, or both are programmable and are selected to allow the comparator to distinguish between a high-resistance state and a low-resistance state of a resistive element of the resistive random access memory cell.

In another feature, the current is programmable and is selected based on process variations.

In other features, the current, the second voltage, or both are programmable and are selected during manufacture of a memory array comprising the resistive random access memory cell, or in response to a power supply to the memory array comprising the resistive random access memory cell being turned on, or both.

In other features, the second voltage is (i) adjustable between a reference voltage and a supply voltage of a memory array comprising the resistive random access memory cell, (ii) less than a voltage that damages the resistive random access memory cell, and (iii) selected to allow sensing of a high-resistance state and a low-resistance state of a resistive element of the resistive random access memory cell.

In other features, the comparing is performed using an inverter, and the inverter includes transistors having a selected threshold voltage. The selected threshold voltage allows reducing a supply voltage of a memory array comprising the resistive random access memory cell to less than a selected value to save power and lowering the second voltage to less than the supply voltage. The selected threshold voltage allows reducing a supply voltage of a memory array comprising the resistive random access memory cell to less than the selected threshold voltage while allowing sensing of a high-resistance state and a low-resistance state of a resistive element of the resistive random access memory cell.

In other features, the method further comprises using a comparator to perform the comparison, turning on the comparator in response to receiving the pulse, turning off the comparator in response to latching an output of the comparator, and generating a latched output.

In other features, the method further comprises supplying a third voltage to the word line in response to selecting the word line. The third voltage less than a sum of a voltage that damages the resistive random access memory cell and a threshold voltage of a transistor used as a switching element in the resistive random access memory cell.

In other features, the method further comprises receiving a feedback voltage from the bit line and a third voltage that is less than a voltage that damages the resistive random access memory cell, and limiting the first voltage to less than the voltage that damages the resistive random access memory cell.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1C:
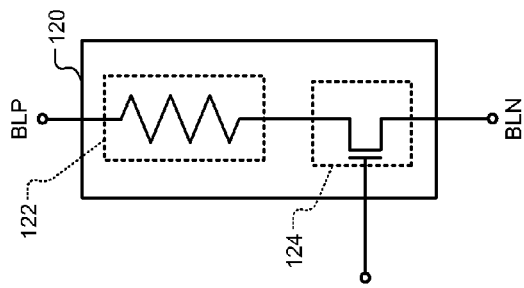
FIG. 1C is a schematic of a RRAM cell.
Figure 1A:
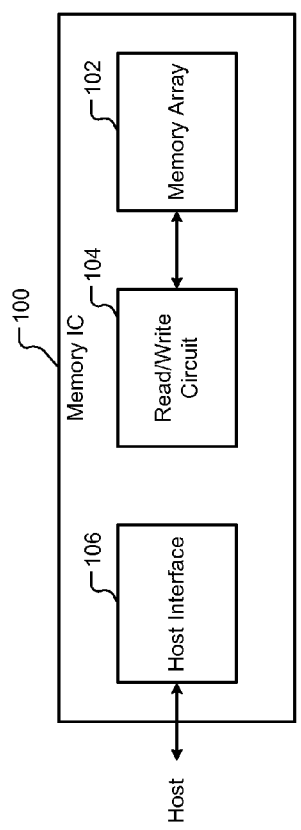
FIG. 1A is a functional block diagram of a memory integrated circuit (IC) comprising resistive random access memory (RRAM) cells.

FIG. 1A shows a memory integrated circuit (IC) 100. The memory IC 100 includes a memory array 102, a read/write circuit 104, and a host interface 106. The memory array 102 includes a plurality of resistive random access memory (RRAM) cells (hereinafter resistive memory cells). The memory array 102 includes a plurality of word lines and a plurality of bit lines. The bit lines may be perpendicular to the word lines. The resistive memory cells are arranged at intersections of the word lines and bit lines. The read/write circuit 104 reads data from and writes data to the resistive memory cells. The host interface 106 interfaces the memory IC 100 to a host.

The host interface 106 receives read/write commands from the host and outputs the read/write commands to the read/write circuit 104. In response to a read command, the read/write circuit 104 reads data from the resistive memory cells in the memory array 102 and outputs the read data to the host interface 106. The host interface 106 forwards the read data to the host. In response to a write command, the read/write circuit 104 writes data to the resistive memory cells in the memory array 102.

Figure 1B:
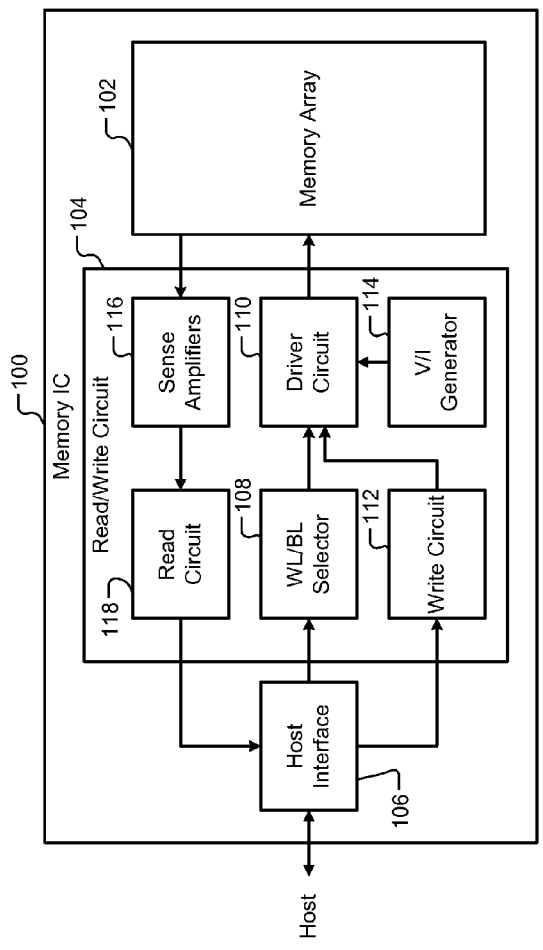
FIG. 1B is a detailed functional block diagram of the memory IC of FIG. 1A.

FIG. 1B shows the read/write circuit 104 of the memory IC 100 in further detail. The read/write circuit 104 includes a word line (WL)/bit line (BL) selector 108, a driver circuit 110, a write circuit 112, a voltage/current (V/I) generator 114, a plurality of sense amplifiers 116, and a read circuit 118. When the host interface 106 receives a write command, the host interface 106 outputs the address or addresses of memory cells in the memory array 102 where data needs to be written and outputs the data to be written in the memory cells to the write circuit 112. Based on the address or addresses of the memory cells, the WL/BL selector 108 selects appropriate word lines to select the memory cells for writing data. The driver circuit 110 receives the data from the write circuit 112. Based on the data, the driver circuit 110 selects one or more voltages (and/or currents) generated by the V/I generator 114 and applies the one or more voltages (and/or currents) to the selected word lines and bit lines and writes the data to the selected memory cells.

When the host interface 106 receives read command, the host interface 106 outputs the address or addresses of memory cells in the memory array 102 from which data needs to read. Based on the address or addresses of the memory cells, the WL/BL selector 108 selects appropriate word lines to select the memory cells from which data is to be read. The driver circuit 110 selects one or more voltages (and/or currents) generated by the V/I generator 114 and applies the one or more voltages (and/or currents) to the selected word lines and bit lines. The sense amplifiers 116 sense voltages on the bits lines (or currents through the bits lines) and sense the states of (i.e., read data stored in) the selected memory cells. The read circuit 118 reads the data sensed by the sense amplifiers 116 and outputs the read data to the host interface 106.

FIG. 1C shows an example of a resistive memory cell 120 of the memory array 102. The resistive memory cell 120 shown is a bipolar resistive memory cell. The resistive memory cell 120 includes a resistive element 122 and a switching element 124. The resistive element 122 and the switching element 124 are connected in series. For example only, the switching element 124 includes a metal-oxide semiconductor field-effect transistor (MOSFET). A gate of the switching element 124 is connected to a word line. A first terminal of the resistive element 122 is connected to a positive bit line (BLP). A second terminal of the resistive element 122 is connected to a first terminal of the switching element 124 (e.g., a drain of the MOSFET). The second terminal of the switching element 124 (e.g., a source of the MOSFET) is connected to a negative bit line (BLN).

The resistive memory cell 120 is selected using the word line. The resistive memory cells 120 can be programmed to a first state (e.g., a high resistance state) or a second state (e.g., a low resistance state). For example, the resistive memory cell 120 can be programmed to the first state by passing current in a first direction through the resistive element 122 (e.g., from BLP to BLN), or to the second state by passing current in a second direction to the resistive element 122 (e.g., from BLN to BLP).

To read a state of (i.e., data stored in) the resistive memory cell 120, the word line connected to the resistive memory cell 120 is selected. A current is forced through the resistive memory cell 120 through the bit line connected to the resistive memory cell 120, and a voltage on the bit lines is sensed. The voltage is high if the resistive memory cell 120 is programmed to the high resistance state and low if the resistive memory cell 120 is programmed to the low resistance state.

Alternatively, a voltage is applied to the bit line connected to the resistive memory cell 120, and current through the bit lines is sensed. The current is low if the resistive memory cell 120 is programmed to the high resistance state and high if the resistive memory cell 120 is programmed to the low resistance state.

The present disclosure relates to several systems and methods for reading resistive random access memory (RRAM) cells. Briefly, in a first method, time driven voltage sensing is used to read the RRAM cells. Inverters are used as comparators to minimize die area. Outputs of the inverters are latched using a pulse having a programmable delay. The inverters use a power supply that is programmable between a supply voltage $V_{DD}$ and a reference potential $V_{SS}$. The inverters can use transistors with a low threshold voltage, which allows lowering the supply voltage, which in turn lowers voltage stress on RRAM cells. The transistors can also be operated in sub-threshold voltage region. In a second method, current-driven voltage sensing is used to read the RRAM cells, where inverters are used as comparators, and programmable currents are sourced through the RRAM cells. Alternatively, in addition to the programmable currents, sense amplifiers with programmable reference voltages are used. In a third method, in addition to the programmable currents and the sense amplifiers with programmable reference voltages, voltages applied to the word lines and bit lines during read operations are limited to a value that does not cause voltage stress (damage due to high voltage) to the RRAM cells. The systems and methods are described below in detail.

Throughout the present disclosure, references are made to low threshold voltage $V_t$ of transistors and low power supply voltage $V_{DD}$. Following are examples of the low threshold voltage $V_t$ and the low power supply voltage $V_{DD}$. For example, the low threshold voltage may be 200 mV for transistors manufactured using deep sub-micron processes. For example, the low power supply voltage $V_{DD}$ may be one-half of a normal power supply voltage $V_{DD}$ for deep sub-micron processes. For example, the normal power supply voltage $V_{DD}$ for deep sub-micron processes may be 1V. Accordingly, an example of the low power supply voltage $V_{DD}$ for deep sub-micron processes may be 0.5V. As another example, the low power supply voltage $V_{DD}$ for deep sub-micron processes may be between 0.5V and the low threshold voltage (e.g., 200 mV).

Figure 2A:
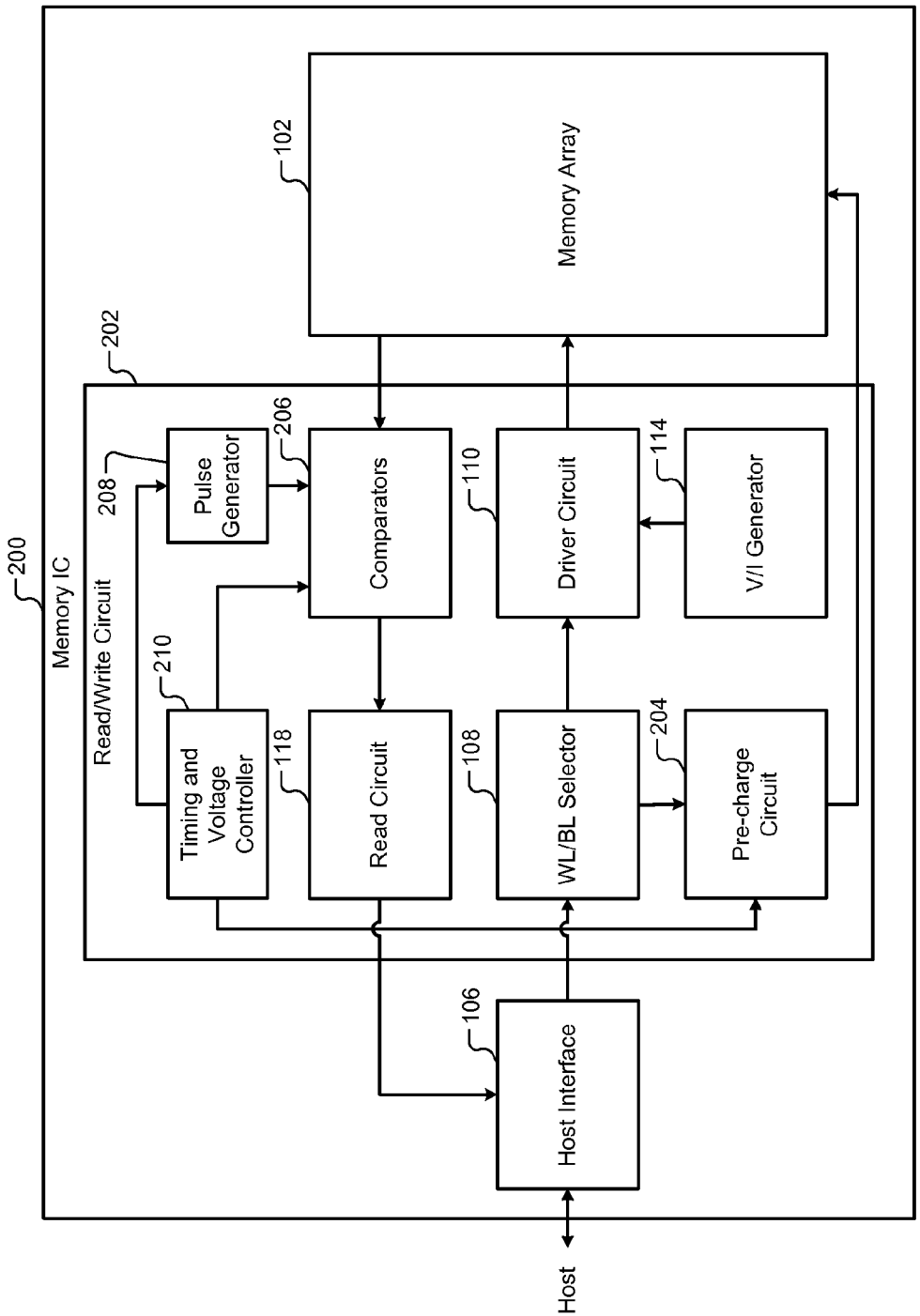
FIG. 2A is functional block diagram of a memory IC comprising a read/write circuit that uses time driven voltage sensing to read RRAM cells.

FIG. 2A shows a memory integrated circuit (IC) 200 including the memory array 102, a read/write circuit 202, and the host interface 106. The read/write circuit 202 includes the WL/BL selector 108, the driver circuit 110, the V/I generator 114, and the read circuit 118, which are described with reference to FIG. 1B, and the description of which is omitted to avoid repetition. The read/write circuit 202 additionally includes a pre-charge circuit 204, comparators 206, a pulse generator 208, and a timing and voltage controller 210, which are described below with reference to FIG. 2B.

Figure 2B:
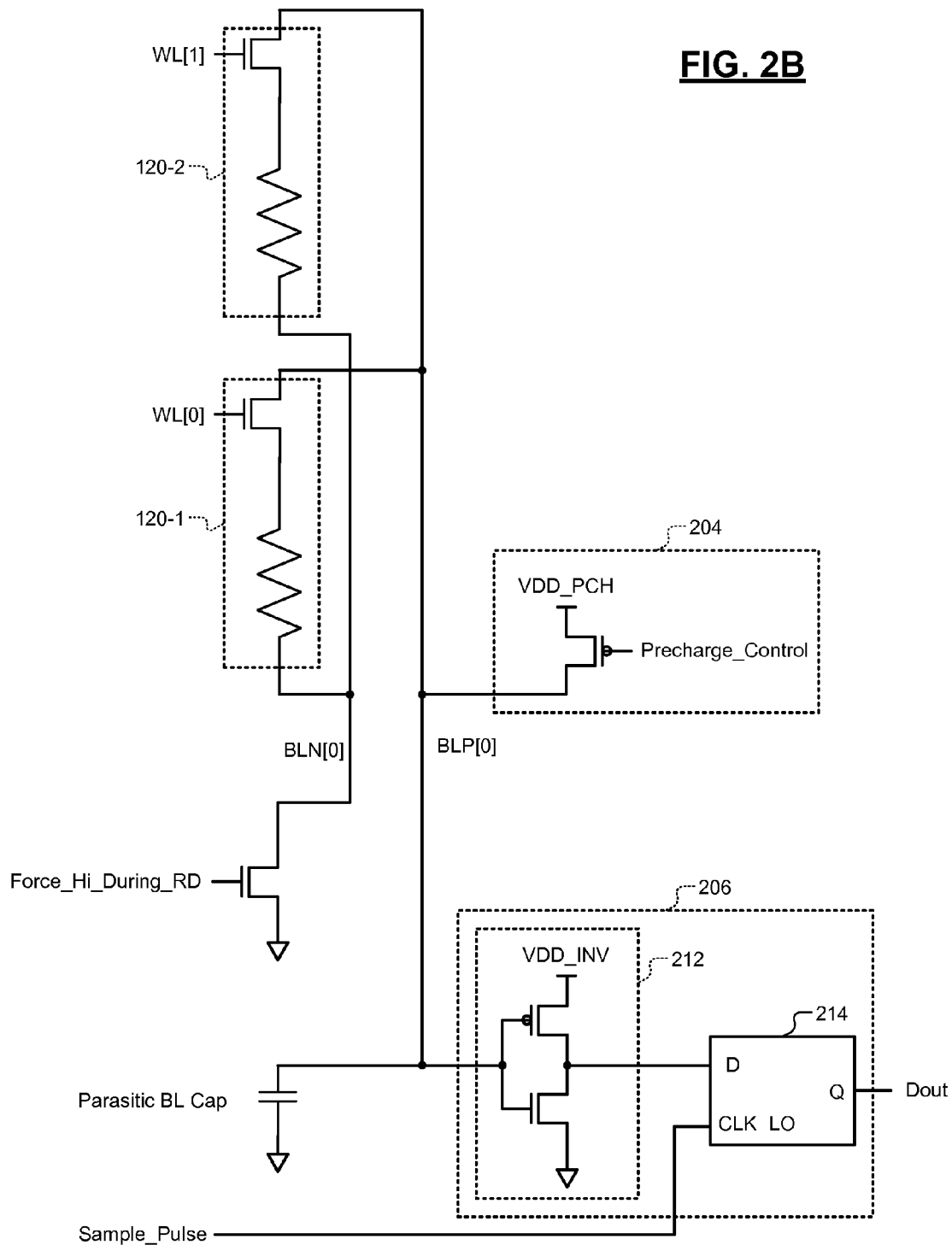
FIG. 2B depicts an example of the time driven voltage sensing.

FIG. 2B shows an example of the time driven voltage sensing according to the present disclosure. For example only, resistive memory cells 120-1 and 120-2 of the memory array 102 are shown. The resistive memory cell 120-1 is connected to the word line WL0. The resistive memory cell 120-2 is connected to the word line WL1. Bit lines BLN0 and BLP0 are used to read and write data to the resistive memory cells 120-1 and 120-2.

To read the state of (i.e., the data stored in) the resistive memory cells 120-1 and 120-2, the pre-charge circuit 204 pre-charges the bit line BLP0 to a pre-charge voltage $V_{DD\_PCH}$ while the word lines WL0 and WL1 are unselected. The WL/BL selector 108 may select the word line WL0 or WL1 to read the resistive memory cell 120-1 or 120-2, respectively. After a word line is selected, the comparator 206 connected to the bit line BLP0 waits a predetermined length of time to sample the bit line BLP0 while the bit line BLP0 discharges at a rate determined by the resistance of the resistive memory cells 120-1 or 120-2, whichever is selected. The rate of discharge (i.e., the rate of bit line voltage decreasing) is slower if the selected resistive memory cell is programmed to a high resistance state than if the selected memory cell is programmed to a low resistance state. After the predetermined length of time, the pulse generator 208 generates a pulse that latches the output of the comparator 206. The latched output of the comparator 206 represents the state of the selected resistive memory cell.

The comparator 206 includes an inverter 212, which is used as a comparator, and a latch 214. The output of the inverter 212 is input to the latch 214. The pulse generated by the pulse generator 208 clocks the latch 214, which latches the output of the inverter 212.

The timing and voltage controller 210 controls the predetermined length of time after which the pulse generator 208 generates a pulse. The predetermined length of time, which is a delay, is programmable. For example, the timing and voltage controller 210 may select the delay from a range of pre-selected values for optimum read operation based on known parasitic BL capacitance, range of low resistance values and high resistance values of the resistive elements, and the switching transistor characteristics of the resistive memory cells.

To minimize the effect of chip-to-chip process variations as well as on-chip variations, the timing and voltage controller 210 may set the delay to a different value for each chip including multiple RRAM memory arrays or a different value for each RRAM memory array within a chip. An optimum value for the delay may be set at the factory permanently with using e-fuse or one-time-programmable memory, or other embedded non-volatile memory including RRAM. Alternatively, in use, upon each power-up of the RRAM memory, the timing and voltage controller 210 may run a diagnostic routine to determine the optimum value for the delay and store the value in a set of registers, which can be updated at each power-up. The pulse generator 208 may use the values stored in the registers to generate pulses with appropriate delays during the operations.

The timing and voltage controller 210 also controls the values of the pre-charge voltage $V_{DD\_PCH}$ and the supply voltage $V_{DD\_INV}$ of the inverter 212. The timing and voltage controller 210 may adjust the values between the supply voltage $V_{DD}$ and the reference voltage $V_{SS}$ depending on two factors: First, a maximum safe voltage (voltage that does not cause stress to the resistive memory cells) allowed to avoid cell disturb; and second, an optimum voltage required to sense both low and high resistance states with maximum margin. If $V_{DD\_INV}$ is significantly different than $V_{DD}$, the latch 214 may include a level shifting function as well as latching function. When the selected WL is turned on, after the delay, the SAMPLE_PULSE signal (generated by the pulse generator 208) opens and then closes the gate in the latch 214 to sample the bit line voltage. The latch provides an output according to the $V_{DD}$ domain logic.

The inverter may be implemented with lowest threshold voltage transistors available per given fabrication process if $V_{DD\_INV}$ supply needs to be significantly lower than $V_{DD}$. In addition, the inverter may be operated in a sub-threshold voltage region well below $V_{DD}$ if slower access time is acceptable. Lower threshold voltage and lower power supply voltage $V_{DD}$ lowers the comparator trip point and lowers the stress on the resistive memory cells.

Figure 3A:
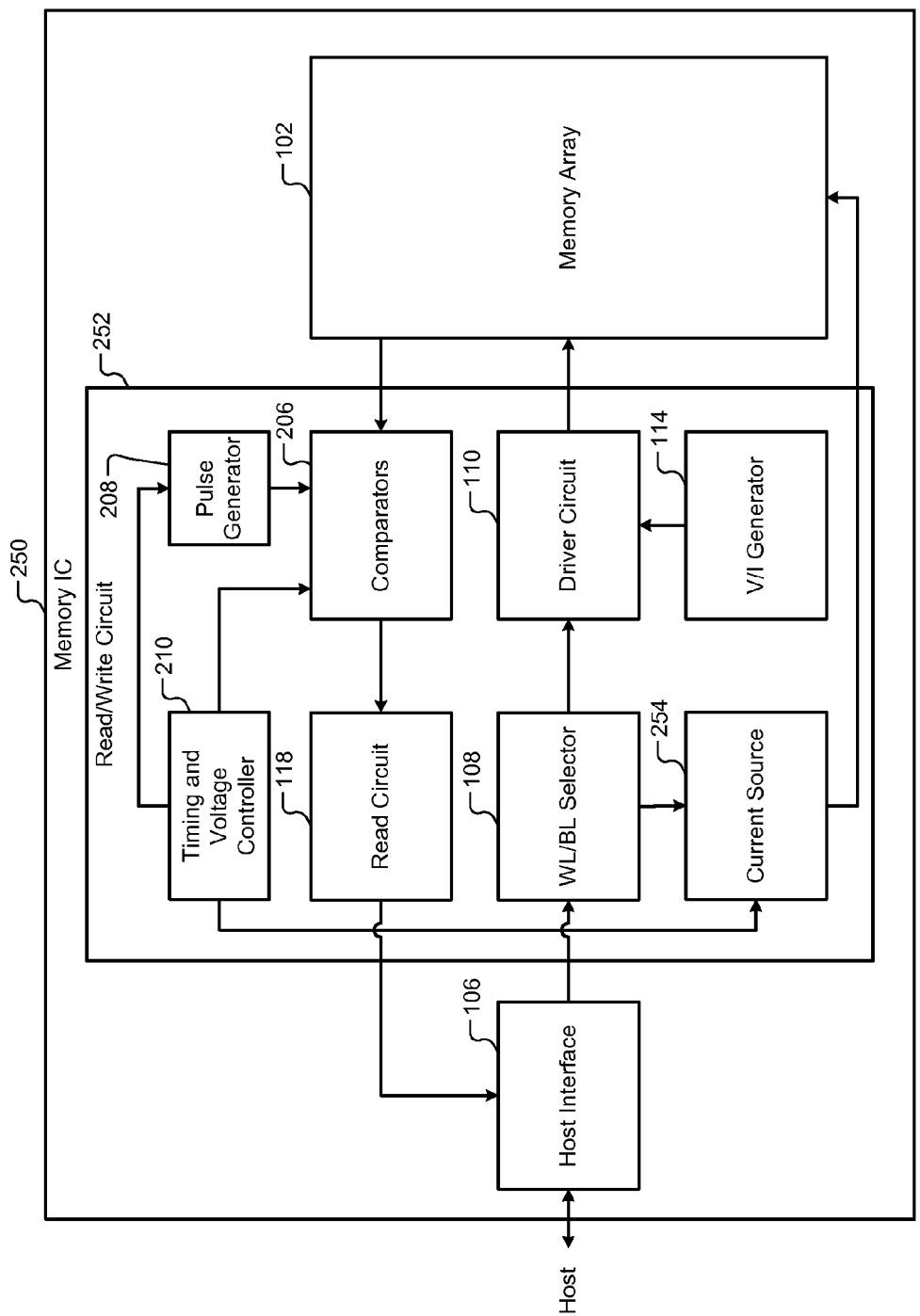
FIG. 3A is functional block diagram of a memory IC comprising a read/write circuit that uses current driven voltage sensing to read RRAM cells.

FIG. 3A shows a memory integrated circuit (IC) 250 including the memory array 102, a read/write circuit 252, and the host interface 106. The read/write circuit 252 of FIG. 3A differs from the read/write circuit 202 of FIG. 2A only in that the read/write circuit 252 uses a current source 254 instead of the pre-charge circuit 204. The operation of the current source 254 is explained below with reference to FIG. 3B. The operation of remaining components of the read/write circuit 252, which are common to the read/write circuit 202, is described only to the extent it differs from the description provided with reference to FIGS. 2A and 2B.

Figure 3B:
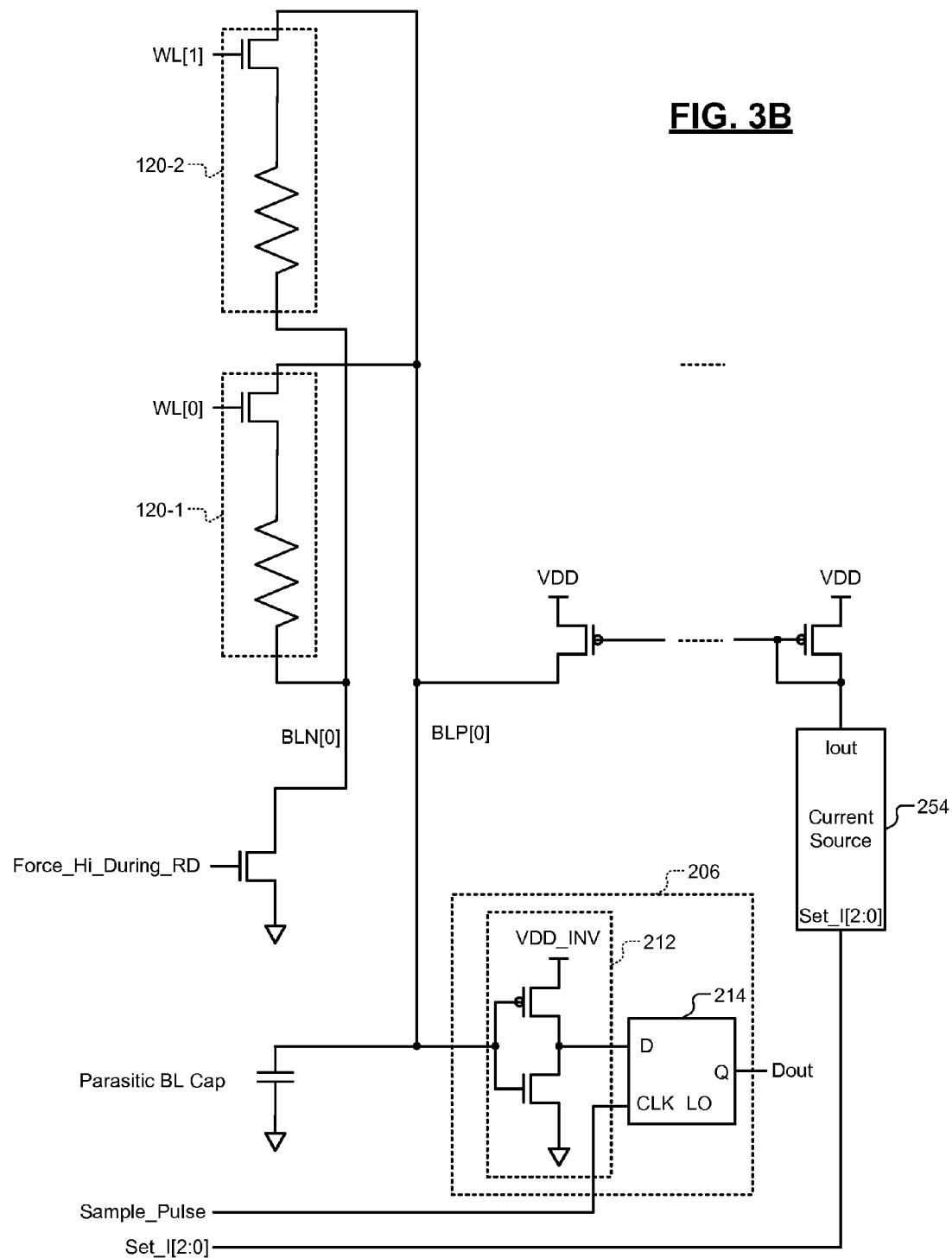
FIG. 3B depicts an example of the current driven voltage sensing.

FIG. 3B shows an example of the current driven voltage sensing according to the present disclosure. For example only, resistive memory cells 120-1 and 120-2 of the memory array 102 are shown. The resistive memory cell 120-1 is connected to the word line WL0. The resistive memory cell 120-2 is connected to the word line WL1. Bit lines BLN0 and BLP0 are used to read and write data to the resistive memory cells 120-1 and 120-2.

To read the state of a selected resistive memory cell, the current source 254 sources current through the selected resistive memory cell via a bit line connected to the selected resistive memory cell. The current source 254 is shared by a plurality of bit lines. Depending on whether the selected resistive memory cell is programmed to a high or low resistance state, the current sourced by the current source 254 through the bit line generates a high or low voltage on the bit line (i.e., at the input of the inverter 212). The latch 214 latches the output of the inverter 212 upon receiving the SAMPLE_PULSE after a delay. The delay is no longer related to the state of the resistive memory cell. Instead, the delay simply needs to be long enough for the bit line voltage to settle.

The timing and voltage controller 210 controls the current source 254. The timing and voltage controller 210 can program the value of the current generated by the current source 254 similar to the programming of the delay described with reference to FIGS. 2A and 2B. The value of the current sourced by the current source 254 can be set at the factory or during each power-up similar to the value of the delay described with reference to FIGS. 2A and 2B. The timing and voltage controller 210 can also adjust the inverter supply voltage $V_{DD\_INV}$ as described with reference to FIGS. 2A and 2B. All other considerations of lower threshold voltage transistors and lower supply voltage $V_{DD}$ described with reference to FIGS. 2A and 2B also apply to FIGS. 3A and 3B.

Figure 4A:
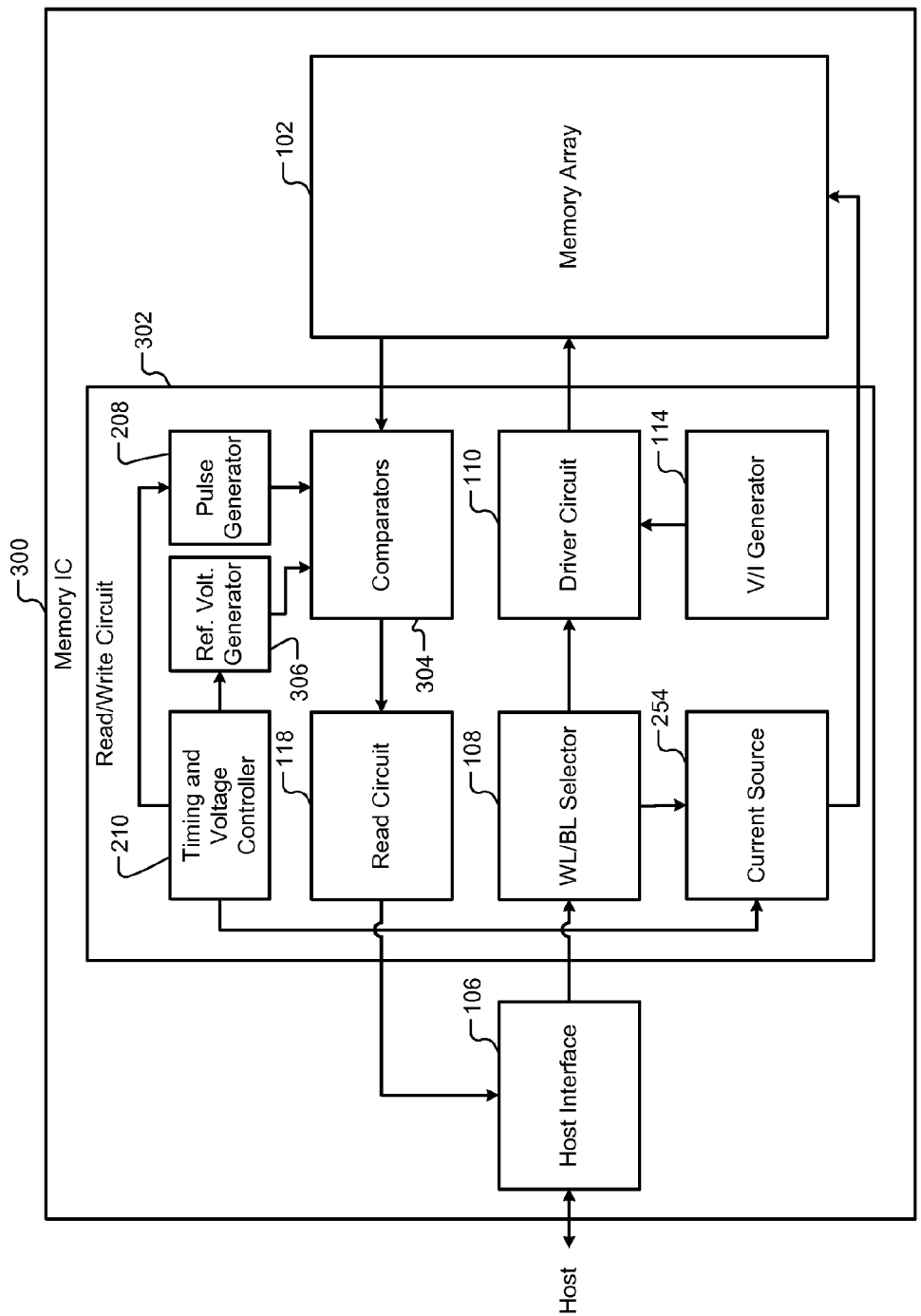
FIG. 4A is functional block diagram of a memory IC comprising a read/write circuit that uses current driven voltage sensing and comparators having programmable reference voltage to read RRAM cells.

FIG. 4A shows a memory integrated circuit (IC) 300 including the memory array 102, a read/write circuit 302, and the host interface 106. The read/write circuit 302 of FIG. 4A differs from the read/write circuit 252 of FIG. 3A only as follows. The read/write circuit 302 uses comparators 304 that include sense amplifiers instead of inverters. The read/write circuit 302 includes a reference voltage generator 306 that supplies a programmable reference voltage to the comparators 304. The timing and voltage controller 210 controls the reference voltage generated by the reference voltage generator 306 as described below. The operation of remaining components of the read/write circuit 302, which are common to the read/write circuit 252, is described only to the extent it differs from the description provided with reference to FIGS. 3A and 3B.

Figure 4B:
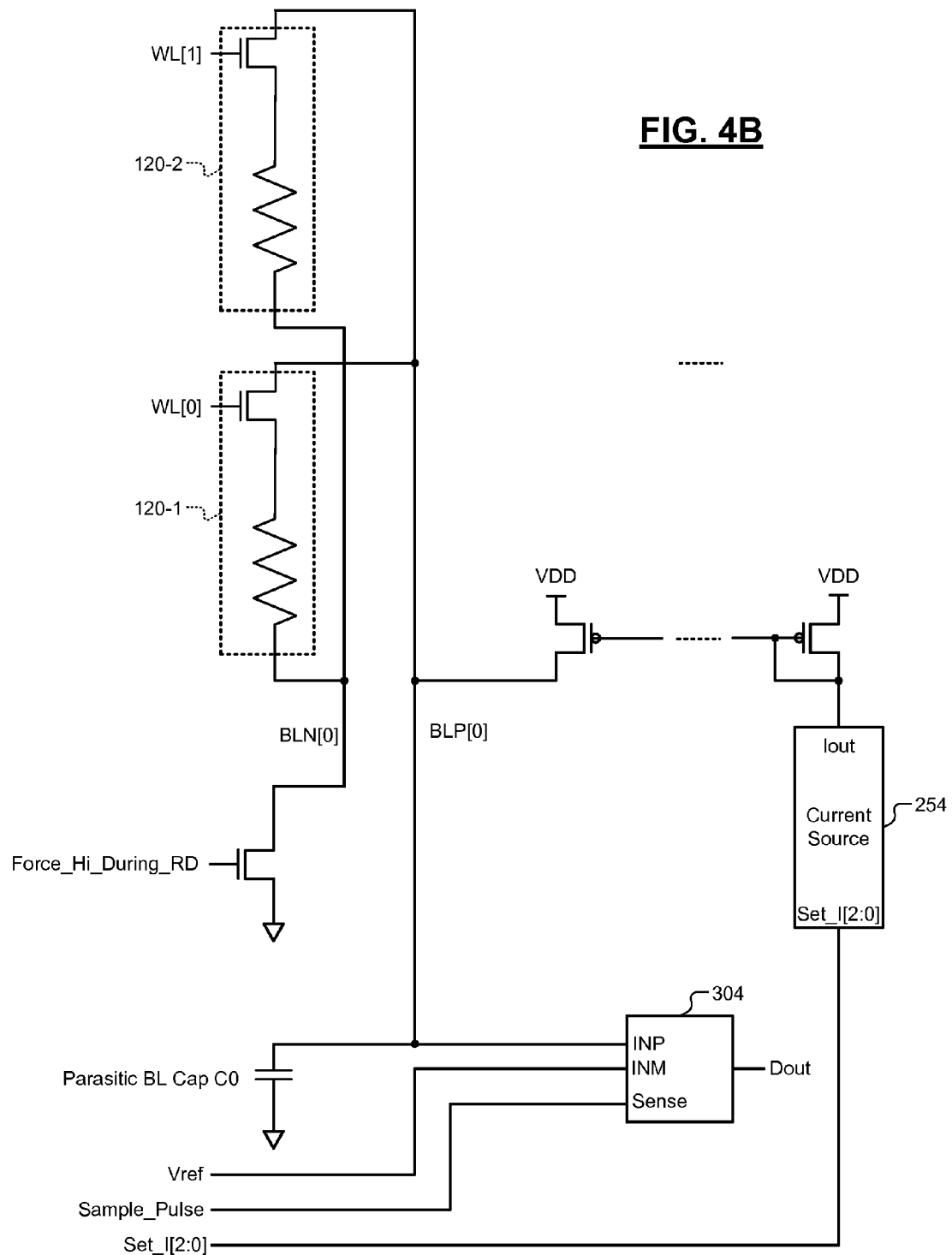
FIG. 4B depicts an example of the current driven voltage sensing and a comparator having a programmable reference voltage to read a RRAM cell.

FIG. 4B shows an example of the comparator 304. For example only, resistive memory cells 120-1 and 120-2 of the memory array 102 are shown. The resistive memory cell 120-1 is connected to the word line WL0. The resistive memory cell 120-2 is connected to the word line WL1. Bit lines BLN0 and BLP0 are used to read and write data to the resistive memory cells 120-1 and 120-2.

To read the state of a selected resistive memory cell, the current source 254 sources current through the selected resistive memory cell via a bit line connected to the selected resistive memory cell. The current source 254 is shared by a plurality of bit lines. Depending on whether the selected resistive memory cell is programmed to a high or low resistance state, the current sourced by the current source 254 through the bit line generates a high or low voltage on the bit line (i.e., at the input of the comparator 304). The comparator 304 is triggered when the comparator 304 receives the SAMPLE_PULSE after a delay. The comparator 304 compares the bit line voltage to the reference voltage $V_{REF}$ supplied by the reference voltage generator 306. The comparator 304 latches the result of the comparison at the output of comparator 304. Again, the delay is no longer related to the state of the resistive memory cell. Instead, the delay simply needs to be long enough for the bit line voltage to settle.

The timing and voltage controller 210 controls the reference voltage generator 306. The timing and voltage controller 210 can program the value of the reference voltage $V_{REF}$ generated by the reference voltage generator 306. The value of the reference voltage $V_{REF}$ can be set to provide maximum margin for reading low and high resistance states. The timing and voltage controller 210 can program the reference voltage $V_{REF}$ similar to the programming of the current described with reference to FIGS. 3A and 3B. The value of the reference voltage $V_{REF}$ can be set at the factory or during each power-up similar to the value of the delay described with reference to FIGS. 2A and 2B. The timing and voltage controller 210 controls the current source 254 as described with reference to FIGS. 3A and 3B. All other considerations of lower threshold voltage transistors and lower supply voltage $V_{DD}$ described with reference to FIGS. 3A and 3B also apply to FIGS. 4A and 4B.

In the examples described with reference to FIGS. 2A-4B, to prevent cell disturb during read operation, the voltage across the resistive element needs to be limited to a safe range. One way to prevent disturb is by limiting WL voltage applied by the driver circuit 110 to a sum of the following two voltages: First, a safe voltage $V_{safe}$ (i.e., a maximum voltage that can be applied to the resistive element without stressing the resistive element); and second, the threshold voltage $V_t$ of the word line select transistor, the switching element 124 shown in FIG. 1C. The timing and voltage controller 210 can set the supply voltage of the driver circuit 110 equal to the sum during read operations. Alternatively, the bit line voltage can be limited to $V_{safe}$ as follows.

Figure 5A:
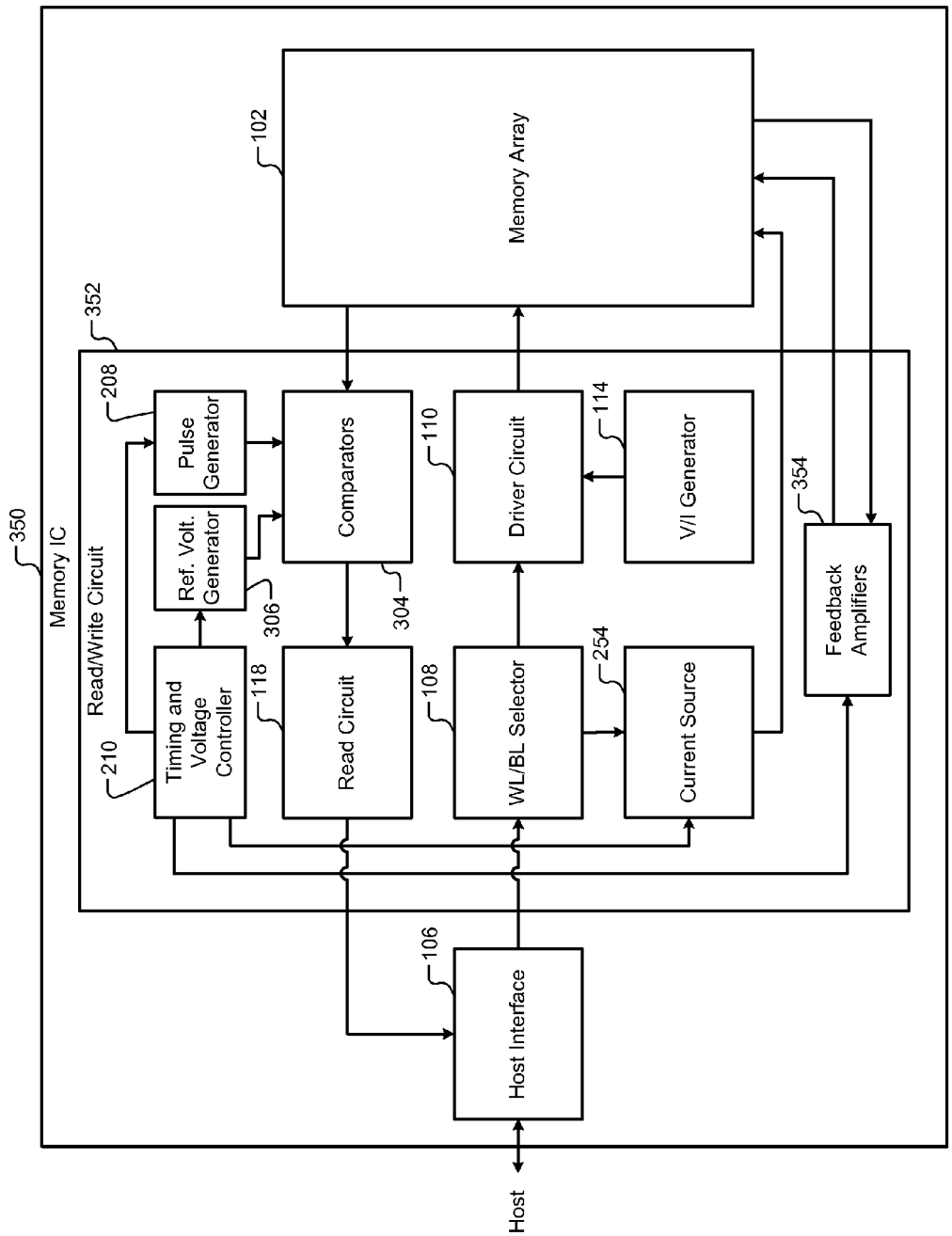
FIG. 5A is functional block diagram of a memory IC comprising a read/write circuit that uses feedback amplifiers to protect RRAM cells from stress.

FIG. 5A shows a memory integrated circuit (IC) 350 including the memory array 102, a read/write circuit 352, and the host interface 106. The read/write circuit 352 of FIG. 5A includes all of the components of the read/write circuit 302 of FIG. 4A and additionally includes feedback amplifiers 354, the operation of which is explained below with reference to FIG. 5B.

Figure 5B:
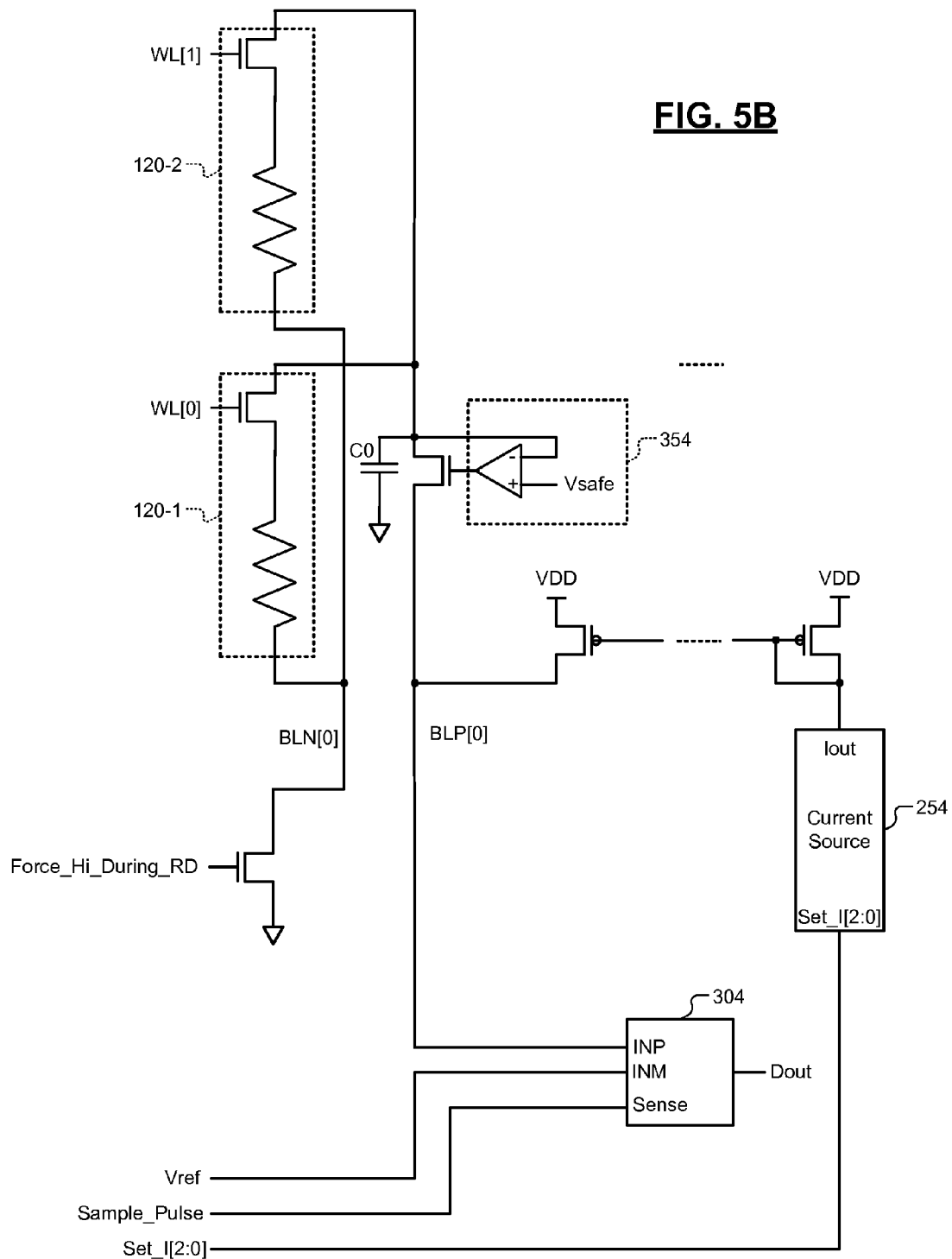
FIG. 5B depicts an example of a feedback amplifier used to protect a RRAM cell from stress.

FIG. 5B is similar to FIG. 4A except that the feedback amplifier 354 is connected to the bit line through an additional NMOSFET as shown. A first input of the feedback amplifier 354 is $V_{safe}$, and a second input of the feedback amplifier 354 is the bit line voltage. The NMOSFET operates as a common gate amplifier. The feedback amplifier 354 limits the bit line voltage to $V_{safe}$.

Figure 6:
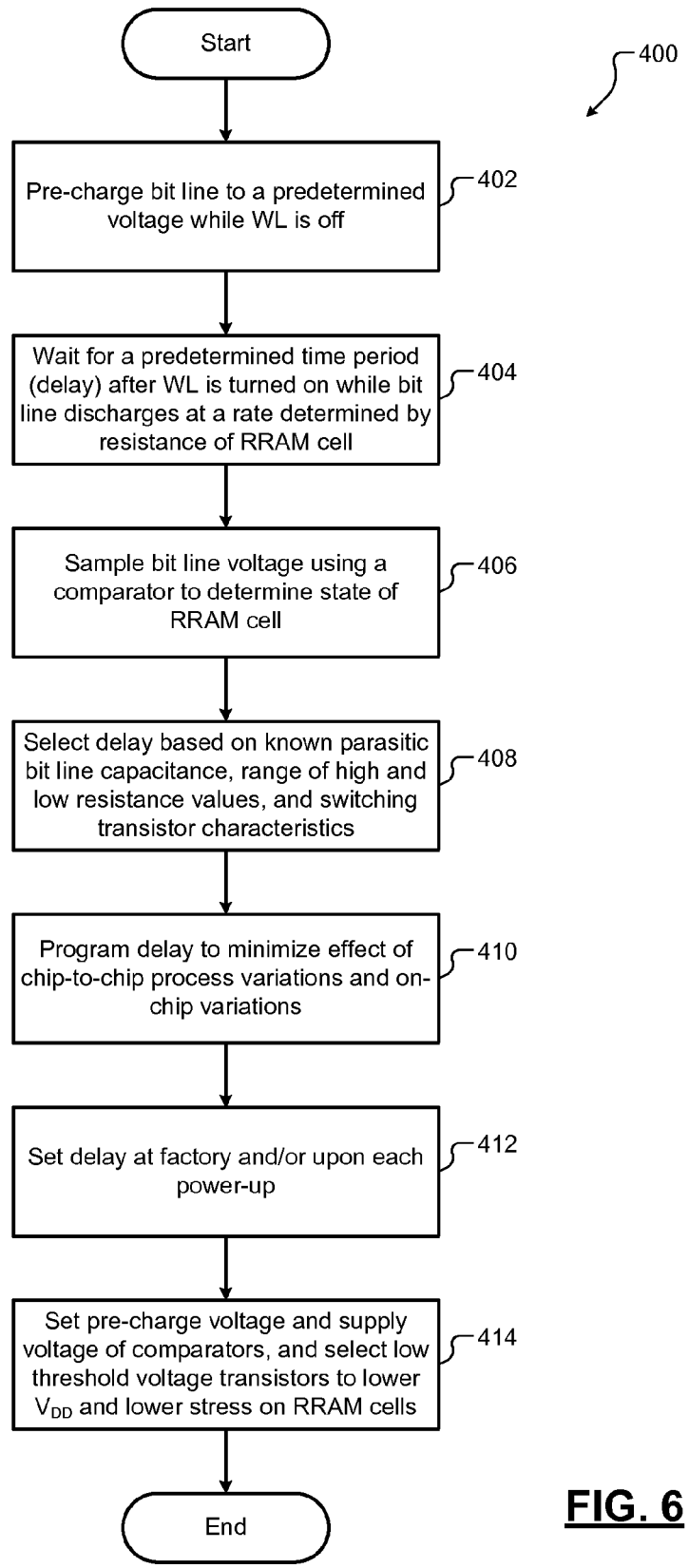
FIG. 6 is a flowchart of a method for reading RRAM cells using time driven voltage sensing.

FIG. 6 shows a method 400 for reading a resistive memory cell using a time driven voltage sensing according to the present disclosure. At 402, the method 400 pre-charges a bit line connected to the resistive memory cell to a predetermined voltage while the word line connected to the resistive memory cell is off. At 404, the method 400 waits for a predetermined time period (delay) after the word line connected to the resistive memory cell is turned on while the bit line discharges at a rate determined by the resistance of the resistive memory cell. At 406, the method 400 samples the bit line voltage using a comparator to determine the state of the resistive memory cell.

At 408, the method 400 selects the delay based on known parasitic bit line capacitance, range of high and low resistance values of the resistive memory cells, and switching transistor characteristics of the resistive memory cells. At 410, the method 400 programs the value of the delay to minimize the effects of chip-to-chip process variations and on-chip variations. At 412, the method 400 sets the value of the delay at factory and/or upon each power up. At 414, the method 400 sets the values of the pre-charge voltage and the supply voltage of the comparators and selects low threshold voltage transistors to lower the supply voltage $V_{DD}$ and to lower stress on the resistive memory cells.

Figure 7:
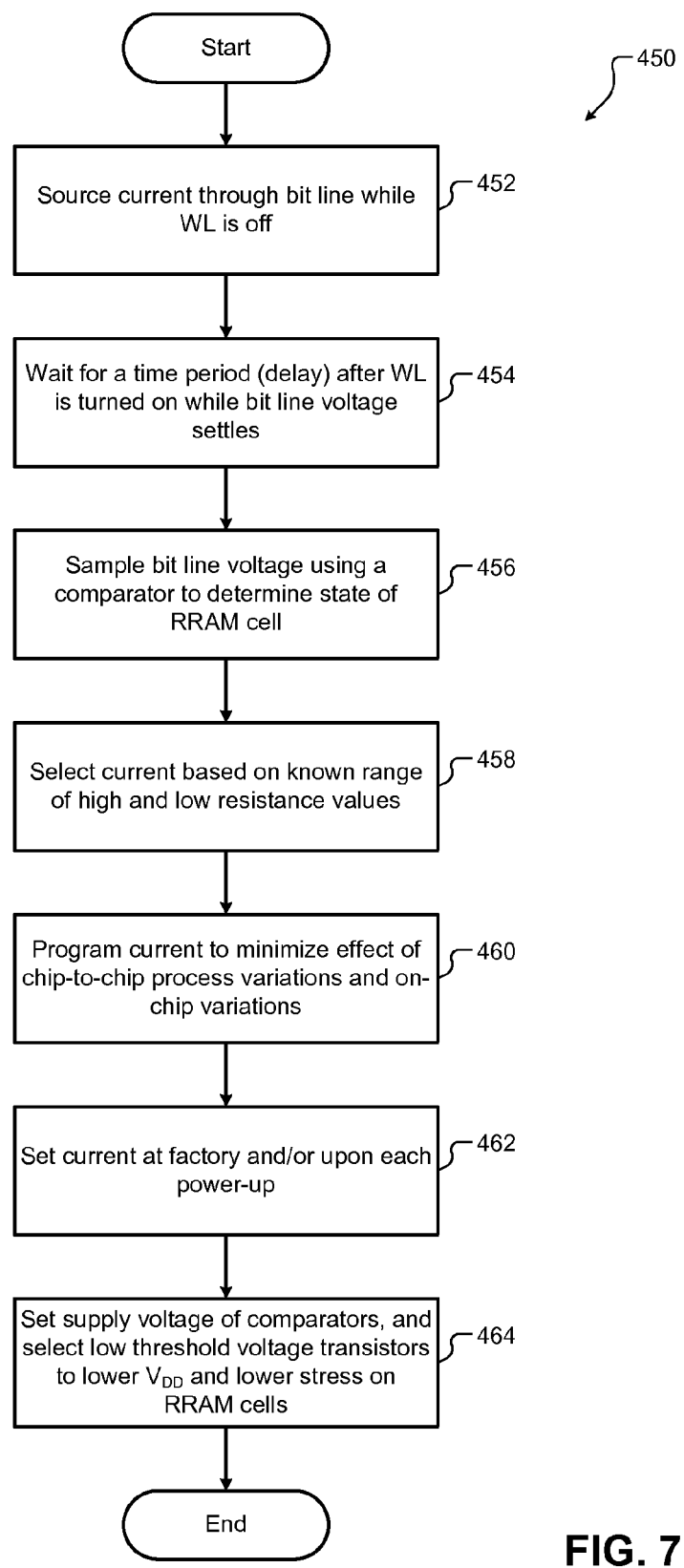
FIG. 7 is a flowchart of a method for reading RRAM cells using current driven voltage sensing.

FIG. 7 shows a method 450 for reading a resistive memory cell using current driven voltage sensing according to the present disclosure. At 452, the method 450 sources current through a bit line connected to the resistive memory cell while the word line connected to the resistive memory cell is off. At 454, the method 450 waits for a time period (delay) after the word line connected to the resistive memory cell is turned on while the bit line voltage settles. At 456, the method 450 samples the bit line voltage using a comparator to determine the state of the resistive memory cell.

At 458, the method 450 selects the current based on a known range of high and low resistance values of the resistive memory cells of the resistive memory cells. At 460, the method 450 programs the value of the current to minimize the effects of chip-to-chip process variations and on-chip variations. At 462, the method 450 sets the value of the current at factory and/or upon each power up. At 464, the method 450 sets the value of the supply voltage of the comparators and selects low threshold voltage transistors to lower the supply voltage $V_{DD}$ and to lower stress on the resistive memory cells.

Figure 8:
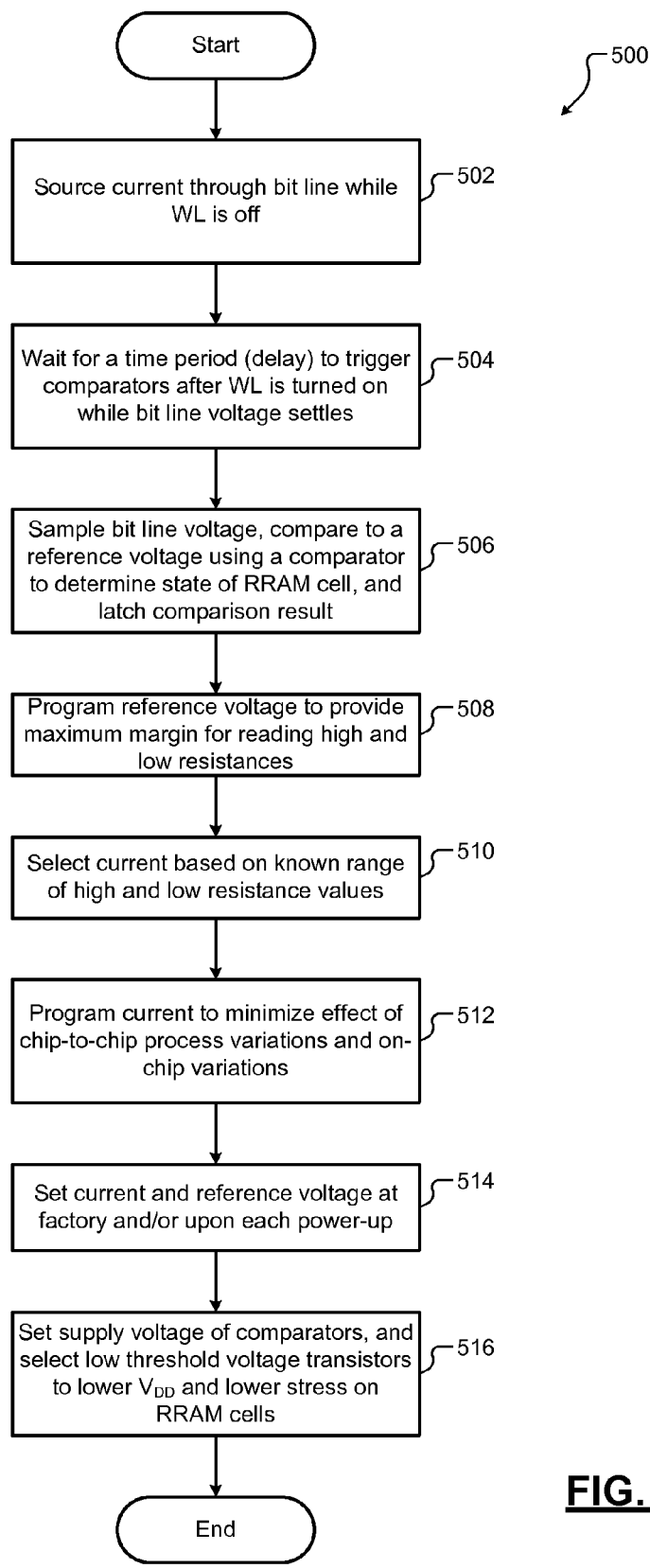
FIG. 8 is a flowchart of a method for reading RRAM cells using comparators having programmable reference voltage.

FIG. 8 shows a method 500 for reading a resistive memory cell using current driven voltage sensing and programmable reference voltages for comparators according to the present disclosure. At 502, the method 500 sources current through a bit line connected to the resistive memory cell while the selected word line is off. At 504, the method 500 waits for a time period (delay) to trigger comparators after the word line connected to the resistive memory cell is turned on while the bit line voltage settles. At 506, the method 500 samples the bit line voltage and compares the bit line voltage to a reference voltage using a comparator to determine the state of the resistive memory cell, and latches the result of the comparison.

At 508, the method 500 programs the reference voltage to provide maximum margin for reading high and low resistances of the resistive memory cells. At 510, the method 500 selects the current based on a known range of high and low resistance values of the resistive memory cells of the resistive memory cells. At 512, the method 500 programs the value of the current to minimize the effects of chip-to-chip process variations and on-chip variations. At 514, the method 500 sets the value of the current and the reference voltage at factory and/or upon each power up. At 516, the method 500 sets the value of the supply voltage of the comparators and selects low threshold voltage transistors to lower the supply voltage $V_{DD}$ and to lower stress on the resistive memory cells.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A system comprising:
a resistive random access memory cell connected to a word line and a bit line;
a pre-charge circuit configured to pre-charge the bit line to a first voltage with the word line being unselected;
a driver circuit configured to select the word line at a first time subsequent to the bit line being charged to the first voltage;
a comparator configured to compare a second voltage on the bit line to a third voltage supplied to the comparator and generate an output based on the comparison;
a latch configured to latch the output of the comparator and generate a latched output; and
a pulse generator configured to generate a pulse after a delay subsequent to the first time to clock the latch to latch the output of the comparator and generate the latched output,
wherein the latched output indicates a state of the resistive random access memory cell.

2. The system of claim 1, wherein the delay is programmable and is selected based on a parasitic capacitance of the bit line, resistance values corresponding to a high-resistance state and a low-resistance state of a resistive element of the resistive random access memory cell, and characteristics of a switching element of the resistive random access memory cell.

3. The system of claim 1, wherein the delay is programmable and is selected based on process variations.

4. The system of claim 1, wherein the delay is programmable and is selected during manufacture of a memory array comprising the resistive random access memory cell, or in response to a power supply to the memory array comprising the resistive random access memory cell being turned on, or both.

5. The system of claim 1, wherein the comparator includes an inverter, and wherein the first voltage and the third voltage are:
adjustable between a reference voltage and a supply voltage of a memory array comprising the resistive random access memory cell;
less than a voltage that damages the resistive random access memory cell; and
selected to allow sensing of a high-resistance state and a low-resistance state of a resistive element of the resistive random access memory cell.

6. The system of claim 1, wherein:
the comparator includes an inverter,
the inverter includes transistors having a selected threshold voltage, and
the selected threshold voltage allows reducing a supply voltage of a memory array comprising the resistive random access memory cell to less than a selected value to save power and lowering the third voltage to less than the supply voltage.

7. The system of claim 1, wherein:
the comparator includes an inverter,
the inverter includes transistors having a selected threshold voltage, and
the selected threshold voltage allows reducing a supply voltage of a memory array comprising the resistive random access memory cell to less than the selected threshold voltage while allowing sensing of a high-resistance state and a low-resistance state of a resistive element of the resistive random access memory cell.

8. A system comprising:
a resistive random access memory cell connected to a word line and a bit line;
a current source configured to source current through the bit line;
a driver circuit configured to select the word line;
a comparator configured to compare a first voltage on the bit line to a second voltage supplied to the comparator and generate an output based on the comparison;
a latch configured to latch the output of the comparator and generate a latched output; and
a pulse generator configured to generate a pulse after a delay to latch the output of the comparator and generate the latched output,
wherein the delay is greater than a settling time of the first voltage, and
wherein the latched output indicates a state of the resistive random access memory cell.

9. The system of claim 8, wherein the current, the second voltage, or both are programmable and are selected to allow the comparator to distinguish between a high-resistance state and a low-resistance state of a resistive element of the resistive random access memory cell.

10. The system of claim 8, wherein the current is programmable and is selected based on process variations.

11. The system of claim 8, wherein the current, the second voltage, or both are programmable and are selected during manufacture of a memory array comprising the resistive random access memory cell, or in response to a power supply to the memory array comprising the resistive random access memory cell being turned on, or both.

12. The system of claim 8, wherein the comparator includes an inverter, and wherein the second voltage is:
adjustable between a reference voltage and a supply voltage of a memory array comprising the resistive random access memory cell;
less than a voltage that damages the resistive random access memory cell; and
selected to allow sensing of a high-resistance state and a low-resistance state of a resistive element of the resistive random access memory cell.

13. The system of claim 8, wherein:
the comparator includes an inverter,
the inverter includes transistors having a selected threshold voltage, and
the selected threshold voltage allows reducing a supply voltage of a memory array comprising the resistive random access memory cell to less than a selected value to save power and lowering the second voltage to less than the supply voltage.

14. The system of claim 8, wherein:
the comparator includes an inverter,
the inverter includes transistors having a selected threshold voltage, and
the selected threshold voltage allows reducing a supply voltage of a memory array comprising the resistive random access memory cell to less than the selected threshold voltage while allowing sensing of a high-resistance state and a low-resistance state of a resistive element of the resistive random access memory cell.

15. The system of claim 8, wherein the comparator is configured to turn on in response to receiving the pulse and turn off in response to the latch latching the output of the comparator and generating the latched output.

16. The system of claim 8, wherein the driver supplies a third voltage to the word line in response to selecting the word line, wherein the third voltage less than a sum of a voltage that damages the resistive random access memory cell and a threshold voltage of a transistor used as a switching element in the resistive random access memory cell.

17. The system of claim 8, further comprising a feedback amplifier configured to:
receive a feedback voltage from the bit line and a third voltage that is less than a voltage that damages the resistive random access memory cell, and
limit the first voltage to less than the voltage that damages the resistive random access memory cell.

18. A method comprising:
connecting a resistive random access memory cell to a word line and a bit line;
pre-charging the bit line to a first voltage with the word line being unselected;
selecting the word line at a first time subsequent to the bit line being charged to the first voltage;
comparing a second voltage on the bit line to a third voltage supplied to a comparator and generating an output based on the comparison; and
generating a pulse after a delay subsequent to the first time to latch the output of the comparator,
wherein the latched output indicates a state of the resistive random access memory cell.

19. The method of claim 18, wherein the first voltage and the third voltage are:
adjustable between a reference voltage and a supply voltage of a memory array comprising the resistive random access memory cell;
less than a voltage that damages the resistive random access memory cell; and
selected to allow sensing of a high-resistance state and a low-resistance state of a resistive element of the resistive random access memory cell.

20. The method of claim 18, wherein:
the comparing is performed using an inverter,
wherein the inverter includes transistors having a selected threshold voltage,
wherein the selected threshold voltage allows reducing a supply voltage of a memory array comprising the resistive random access memory cell to less than a selected value to save power and lowering the third voltage to less than the supply voltage, and
wherein the selected threshold voltage allows reducing the supply voltage to less than the selected threshold voltage while allowing sensing of a high-resistance state and a low-resistance state of a resistive element of the resistive random access memory cell.

* * * * *